(12) United States Patent  
Koo

(10) Patent No.: US 8,912,575 B2  
(45) Date of Patent: Dec. 16, 2014

(54) SEMICONDUCTOR MEMORY DEVICE AND METHOD OF FABRICATING THE SAME

(71) Applicant: SK Hynix Inc., Gyeonggi-do (KR)

(72) Inventor: Min Gyu Koo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/718,808

(22) Filed: Dec. 18, 2012

(65) Prior Publication Data

US 2014/0054668 A1   Feb. 27, 2014

(30) Foreign Application Priority Data

Aug. 21, 2012   (KR) .................... 10-2012-0091202

(51) Int. Cl.
| | | |
|---|---|---|
| *H01L 27/118* | (2006.01) | |
| *H01L 29/788* | (2006.01) | |
| *H01L 21/28* | (2006.01) | |
| *H01L 21/02* | (2006.01) | |
| *H01L 27/115* | (2006.01) | |

(52) U.S. Cl.
CPC .......... *H01L 29/788* (2013.01); *H01L 29/7881* (2013.01); *H01L 21/28273* (2013.01); *H01L 21/02365* (2013.01); *H01L 27/11524* (2013.01)
USPC ........... 257/202; 257/288; 257/393; 257/774; 257/E21.68; 257/E21.69

(58) Field of Classification Search
USPC ......... 257/202, 288, 314, 315, 390, 391, 392, 257/393, 774, E21.68, E21.681, E21.69
See application file for complete search history.

(56) References Cited

U.S. PATENT DOCUMENTS

| | | | |
|---|---|---|---|
| 7,939,406 B2 * | 5/2011 | Matsui et al. ................ | 438/257 |
| 8,362,545 B2 * | 1/2013 | Yu et al. ....................... | 257/321 |
| 2004/0212008 A1 * | 10/2004 | Hasegawa ................... | 257/316 |
| 2006/0076611 A1 * | 4/2006 | Matsui et al. ................ | 257/316 |

FOREIGN PATENT DOCUMENTS

KR   1020050086293   8/2005

* cited by examiner

*Primary Examiner* — Eduardo A Rodela  
(74) *Attorney, Agent, or Firm* — IP & T Group LLP

(57) ABSTRACT

The semiconductor device includes a semiconductor substrate having a first active area defined by a first isolation layer; a gate insulating layer formed on the semiconductor substrate; a first conductive layer formed on the gate insulating layer; a dielectric layer formed on the first conductive layer; at least one first contact hole passing through the dielectric layer; a second conductive layer, formed on the dielectric layer, the second conductive layer filling the at least one first contact hole to contact the first conductive layer; and at least one first contact plug connected to the second conductive layer in the first active area, wherein the at least one first contact plug is offset from the at least one first contact hole to overlap the dielectric layer.

10 Claims, 7 Drawing Sheets

SEMICONDUCTOR MEMORY DEVICE AND METHOD OF FABRICATING THE SAME

CROSS-REFERENCE TO RELATED APPLICATION

This application claims priority to and the benefit of Korean Patent Application No. 10-2012-0091202, filed on Aug. 21, 2012, the disclosure of which is incorporated herein by reference in its entirety.

BACKGROUND

1. Field

The present invention relates to a semiconductor memory device and a method of fabricating the same. More specifically, the present invention relates to a non-volatile memory device and a method of fabricating the same.

2. Discussion of Related Art

A semiconductor device such as a non-volatile memory device may include a plurality of transistors. In a NAND flash memory device, for example, a plurality of transistors may include memory cell transistors, select transistors, and driving transistors. The memory cell transistors store data are connected in series to configure a memory string. The select transistors are connected to both ends of the memory string to select a memory string. The driving transistors configure a circuit for controlling an operation of the memory string.

In order to increase a degree of integration of a semiconductor device, the sizes of the above-described transistors must be reduced. When a gate resistance of a transistor increases, the operation speed of the transistor decreases. When a circuit of a semiconductor device is formed by taking into account an operation delay time due to the gate resistance of the transistors, the circuit of a semiconductor device may be configured using a gate resistance predicted using a transistor model. However, there is an error between the gate resistance of the transistor applied to a real semiconductor device and the gate resistance of the transistor predicted using the transistor model. If the error is large, a malfunction of the semiconductor device may occur.

SUMMARY OF THE INVENTION

An exemplary embodiment of the present invention is directed to a semiconductor device reducing a malfunction rate and a method of fabricating the same.

In an exemplary embodiment, a semiconductor device includes a semiconductor substrate including a first active area defined by a first isolation layer; a gate insulating layer formed on the semiconductor substrate; a first conductive layer formed on the gate insulating layer; a dielectric layer formed on the first conductive layer; at least one first contact hole passing through the dielectric layer; a second conductive layer, formed on the dielectric layer, the second conductive layer filling the at least one first contact hole to contact the first conductive layer; and at least one first contact plug connected to the second conductive layer in the first active area, wherein the at least one first contact plug is offset from the at least one first contact hole to overlap the dielectric layer.

A method of fabricating an exemplary semiconductor device includes forming a semiconductor substrate including a first active area defined by a first isolation layer, wherein a gate insulating layer and a first conductive layer are stacked over the first active area; forming a dielectric layer over the first conductive layer; forming at least one first contact hole passing through the dielectric layer; forming a second conductive layer on the dielectric layer to fill the at least one first contact hole; forming a gate pattern by etching the second conductive layer, the dielectric layer, and the first conductive layer; forming an interlayer insulating layer over the gate pattern; and forming at least one first contact plug in the first active area, wherein the at least one first contact plug is to be connected to the second conductive, and wherein the at least one first contact plug is offset from the at least one first contact hole to overlap the dielectric layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will be described more fully hereinafter with reference to the accompanying drawings, in which exemplary embodiments of the invention are shown. This invention may, however, be embodied in different forms and should not be construed as limited to the embodiments set forth herein.

Figure 1:
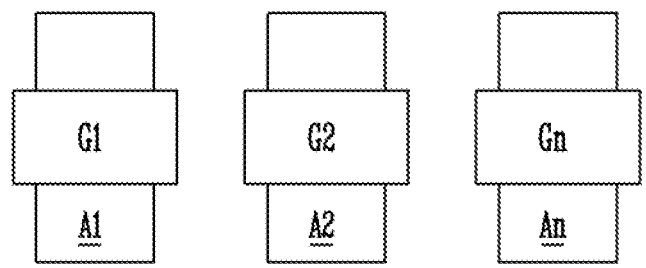
FIG. 1 shows an exemplary semiconductor device.

FIG. 1 shows an exemplary semiconductor device including a plurality of active areas A1 to An spaced apart from each other and a plurality of gate patterns G1 to Gn arranged on the plurality of the active areas A1 to An, respectively, and spaced apart from each other. The plurality of gate patterns G1 to Gn may be connected in common to a metal line (not shown) formed above the gate patterns G1 to Gn. Contact plugs (not shown) are formed between the metal line and each of the gate patterns G1 to Gn, so that the metal line and the gate patterns G1 to Gn are connected.

In the above-described exemplary semiconductor device, a gate resistance may be reduced by connecting the plurality of gate patterns G1 to Gn to the metal line in parallel.

Figure 2:
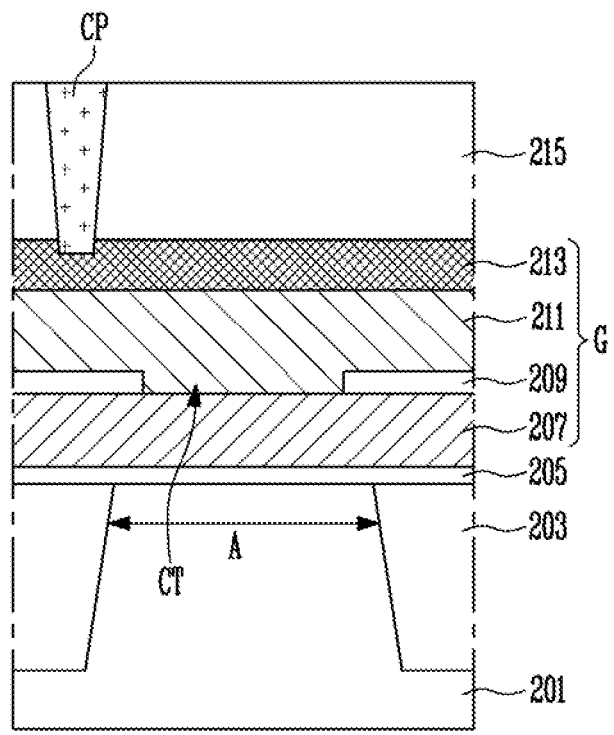
FIG. 2 shows an exemplary semiconductor device.

FIG. 2 shows an exemplary semiconductor device including a semiconductor substrate 201, having an active area A defined by a isolation layer 203, a gate insulating layer 205 formed on the semiconductor substrate 201, and a gate pattern G formed on the gate insulating layer 205. A contact plug CP passes through an interlayer insulating layer 215, formed on the gate pattern G, and is connected to the gate pattern G. The gate pattern G may be formed in a stacked structure including a first conductive layer 207, a dielectric layer 209 and a second conductive layer 211. The second conductive layer 211 is connected to the first conductive layer 207 via a first contact hole CT passing through the dielectric layer 209. The gate pattern G may further include a third conductive layer 213 having a lower resistance than a resistance of the second conductive layer 211. The third conductive layer 213 is formed on the second conductive layer 211.

In an exemplary embodiment the contact plug CP may be formed to overlap the isolation layer 203. Thus, an electric field concentrated on the contact plug CP while fabricating the semiconductor device does not apply stress to the gate insulating layer 205 formed on the active area A.

Figure 3A:
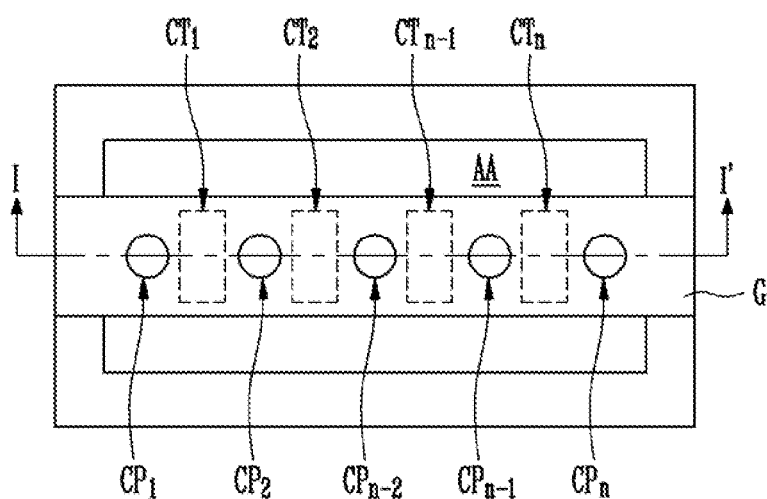
FIGS. 3A and 3B show an exemplary semiconductor device.
Figure 3B:
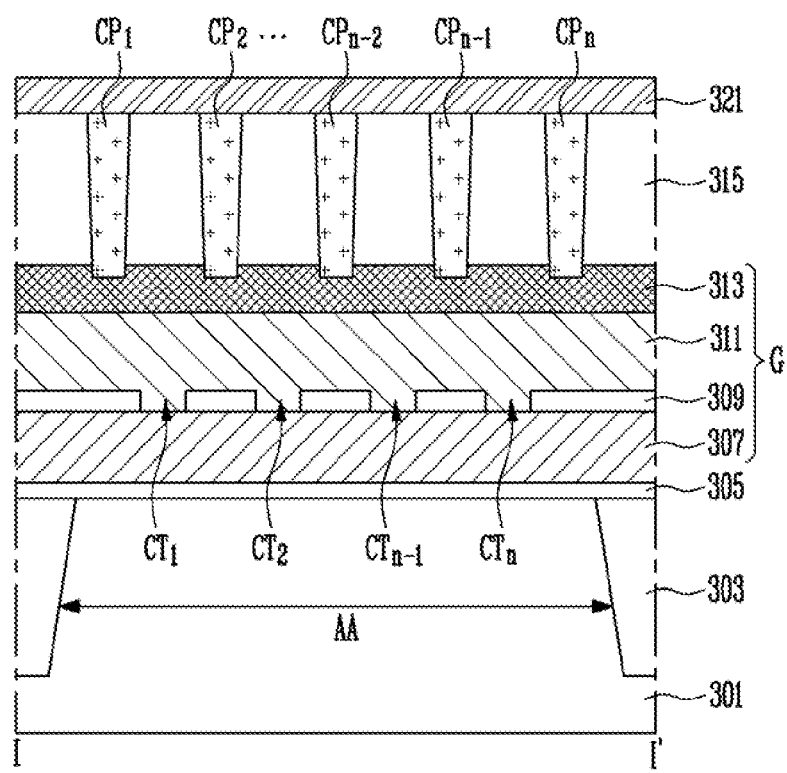

FIGS. 3A and 3B show an exemplary semiconductor device including a peripheral region, a select transistor region, and a memory cell transistor region. FIG. 3A is a layout view showing the exemplary semiconductor device and FIG. 3B is a cross-sectional view showing a peripheral region of the exemplary semiconductor device taken along the line I-I' shown in FIG. 3A. A depiction of a metal line is omitted in FIG. 3A. A select transistor region and a memory cell transistor region will be described later with reference to FIGS. 5A and 5B.

Referring to FIGS. 3A and 3B, the exemplary semiconductor device includes a semiconductor substrate 301 having a first active area AA defined by a first isolation layer 303, a gate insulating layer 305 formed on the semiconductor substrate 301, and a gate pattern G formed on the gate insulating layer 305. Contact plugs $CP_1$ to $CP_n$ pass through an interlayer insulating layer 315, formed on the gate pattern G, and are commonly connected to the gate pattern G. The contact plugs $CP_1$ to $CP_n$ are connected to a metal line 321 formed on the interlayer insulating layer 315. A gate voltage applied to the metal line 321 is applied to the gate pattern G via the contact plugs $CP_1$ to $CP_n$.

The gate pattern G of the exemplary semiconductor device may be formed in a stacked structure of a first conductive layer 307, a dielectric layer 309, and a second conductive layer 311. In a peripheral region, the second conductive layer 311 is connected to the first conductive layer 307 via one of first contact holes $CT_1$ to $CT_n$ passing through the dielectric layer 309. The gate pattern G may further include a third conductive layer 313 having lower resistance than the second conductive layer 311. The third conductive layer 313 may be formed on the second conductive layer 311. For example, the second conductive layer 311 may be formed of polysilicon, and the third conductive layer 313 may be formed of a metal silicide layer, such as a cobalt silicide. The first to third conductive layers 307, 311, and 313, and the dielectric layer 309 may be formed on the first isolation layer 303 as well as on the first active area M, in the peripheral region.

In an exemplary semiconductor device, the first contact holes $CT_1$ to $CT_n$ may be numerously formed on the first active area AA in the peripheral region, and the first contact holes $CT_1$ to $CT_n$ are formed to be spaced apart from each other.

In an exemplary semiconductor device, the contact plugs $CP_1$ to $CP_n$ are formed over the first active area AA and are arranged to be offset from the first contact holes $CT_1$ to $CT_n$, so that each of the contact plugs $CP_1$ to $CP_n$ overlaps a corresponding portion of the dielectric layer 309. The contact plugs $CP_1$ to $CP_n$ may be numerously formed on the first active area AA in the peripheral region, and the plurality of contact plugs $CP_1$ to $CP_n$ may be arranged alternately with the plurality of first contact holes $CT_1$ to $CT_n$. The plurality of contact plugs $CP_1$ to $CP_n$ are commonly connected to the metal line 321 formed on the contact plugs $CP_1$ to $CP_n$.

The operation of a transistor is controlled depending on a signal applied to the gate pattern G formed on the first active area AA. Accordingly, since the parasitic resistance decreases when a current path between the gate pattern G formed on the first active area AA and the metal line 321 becomes shorter, the operation speed of the transistor may increase. In an exemplary semiconductor device, the contact plugs $CP_1$ to $CP_n$ are arranged on the first active area AA, and therefore connected to the gate pattern G formed on the first active area AA. Therefore, the current path between the gate pattern G and the metal line 321 is reduced and a parasitic resistance between the metal line 321 and the gate pattern G may be reduced accordingly. In addition in an exemplary semiconductor device, the contact plugs $CP_1$ to $CP_n$ may be numerously formed to reduce the parasitic resistance due to contact plugs $CP_1$ to $CP_n$.

The parasitic resistance increases an error rate of a transistor model used to predict gate resistance. In an exemplary embodiment, since the parasitic resistance is decreased by the contact plugs $CP_1$ to $CP_n$ arranged on the first active area AA, the error rate of a gate resistance predicted by the transistor model and an actual gate resistance of the transistor in a semiconductor device may be reduced. Accordingly, an exemplary embodiment may reduce the malfunction rate of a semiconductor device.

In an exemplary embodiment, since the parasitic resistance is decreased by the contact plugs $CP_1$ to $CP_n$ connected to a single gate pattern G and overlapping the first active area AA, the malfunction rate of a semiconductor device may be reduced. Since the malfunction rate of the semiconductor device may be reduced using the single gate pattern G, the size of the semiconductor device may be reduced.

In an exemplary embodiment, the contact plugs $CP_1$ to $CP_n$ located on the first active area AA are offset from the first contact holes $CT_1$ to $CT_n$ such that the contact plugs $CP_1$ to $CP_n$ overlap the dielectric layer 309. Accordingly, the gate insulating layer 305 may be protected from the electric field concentrated on the contact plugs $CP_1$ to $CP_n$ by the dielectric layer 309 during the process of fabricating a semiconductor device. As a result, an exemplary embodiment may ensure reliability of the gate insulating layer 305 and reduce the malfunction rate of the semiconductor device.

The gate pattern G, formed in the peripheral region, may configure a circuit that controls the operation of a select transistor and memory cell transistor formed in the select transistor region and the memory cell transistor region. Alternatively, the gate pattern G, formed in the peripheral region, may be a pad connected to a source select line or a drain select line extending from the select transistor region.

Figure 4A:
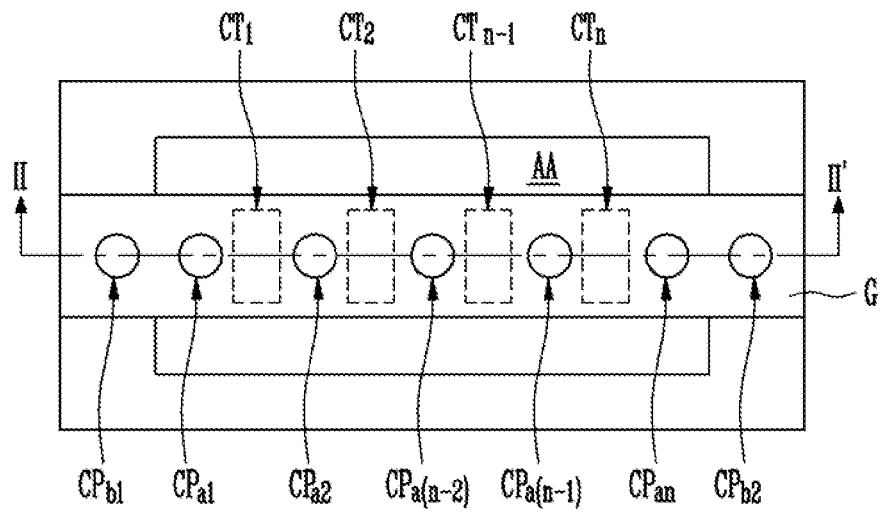
FIGS. 4A and 4B show an exemplary semiconductor device.
Figure 4B:
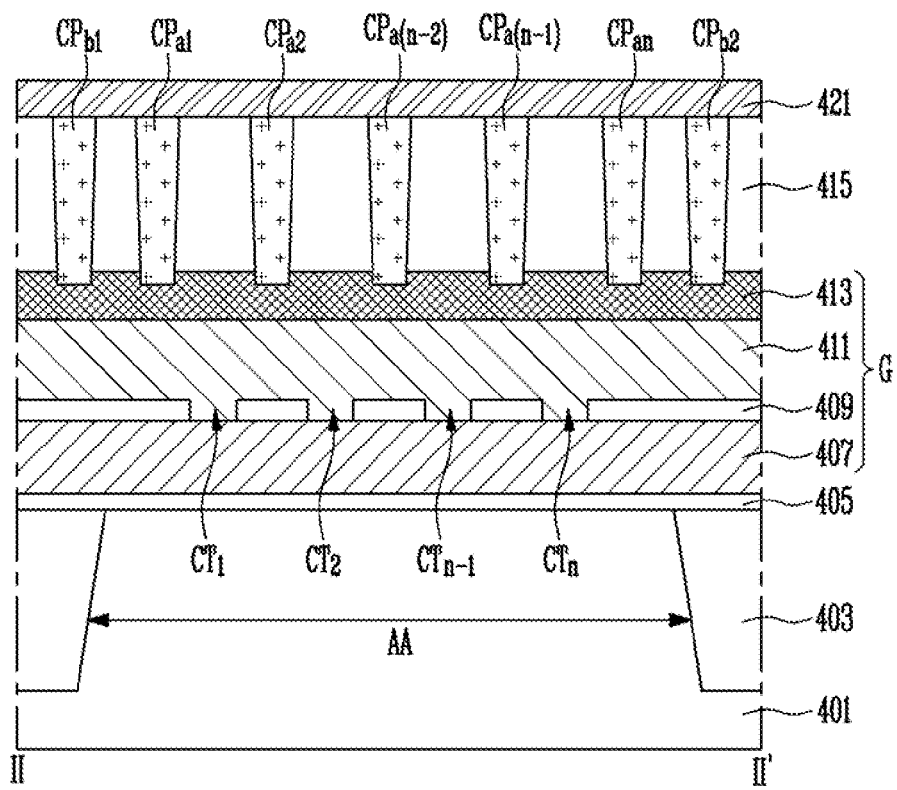

FIGS. 4A and 4B show an exemplary semiconductor device. FIG. 4A is a layout view showing a peripheral region of an exemplary semiconductor device and FIG. 4B is a cross-sectional view showing a peripheral region of an exemplary semiconductor device taken along the line II-II' shown in FIG. 4A. Depiction of a metal line is omitted in FIG. 4A.

Referring to FIGS. 4A and 4B, an exemplary semiconductor includes a semiconductor substrate 401 having a first active area AA defined by a first isolation layer 403, a gate insulating layer 405 formed on the semiconductor substrate 401, and a gate pattern G formed on the gate insulating layer 405. First contact plugs $CP_{a1}$ to $CP_{an}$ and second contact plugs $CP_{b1}$ and $CP_{b2}$ pass through an interlayer insulating layer 415, formed on the gate pattern G, and are commonly connected to the gate pattern G. The first contact plugs $CP_{a1}$ to $CP_{an}$ and the second contact plugs $CP_{b1}$ to $CP_{b2}$ are connected in common to a metal line 421 formed on the interlayer insulating layer 415. A gate voltage applied to the metal line 421 is applied to the gate pattern G via the first contact plugs $CP_{a1}$ to $CP_{an}$ and the second contact plugs $CP_{b1}$ and $CP_{b2}$.

The gate pattern G of an exemplary semiconductor device may be formed in a stacked structure of a first conductive layer 407, a dielectric layer 409, and a second conductive layer 411. In the peripheral region, the second conductive layer 411 passes through the dielectric layer 409, via first contact holes $CT_1$ to $CT_n$, an connects to the first conductive layer 407. The gate pattern G may further include a third conductive layer 413 having a lower resistance than a resistance of the second conductive layer 411. The third conductive layer 413 is formed on the second conductive layer 411. The shapes and materials of the first to third conductive layers 407, 411, and 413 and the dielectric layer 409 and the arrangement of the first contact holes $CT_1$ to $CT_n$ are the same as those described above, with respect to FIGS. 3A and 3B.

The first contact plugs $CP_{a1}$ to $CP_{an}$ are formed over the first active area AA and are offset from the first contact holes $CT_1$ to $CT_n$, so that each of the first contact plugs $CP_1$ to $CP_n$ overlaps a corresponding portion of the dielectric layer 409. The arrangement of the first contact plugs $CP_{a1}$ to $CP_{an}$ is similar to the arrangement of the contact plugs $CP_1$ to $CP_n$ described above, with respect to FIGS. 3A and 3B.

The second contact plugs $CP_{b1}$ and $CP_{b2}$ are formed over the first isolation layer 403 in the peripheral region. Accordingly, a malfunction rate of a semiconductor device may be reduced by reducing the parasitic resistance, as described above with respect to FIGS. 3A and 3B. In addition, since the malfunction rate of the semiconductor device may be reduced using the single gate pattern G, the size of the semiconductor device may be reduced. In addition, the reliability of the gate insulating layer 405 may be enhanced by reducing stress due to the electric field concentrated on the first contact plugs $CP_{a1}$ to $CP_{an}$. Further, the second contact plugs $CP_{b1}$ and $CP_{b2}$ may further reduce the parasitic resistance.

Figure 5A:
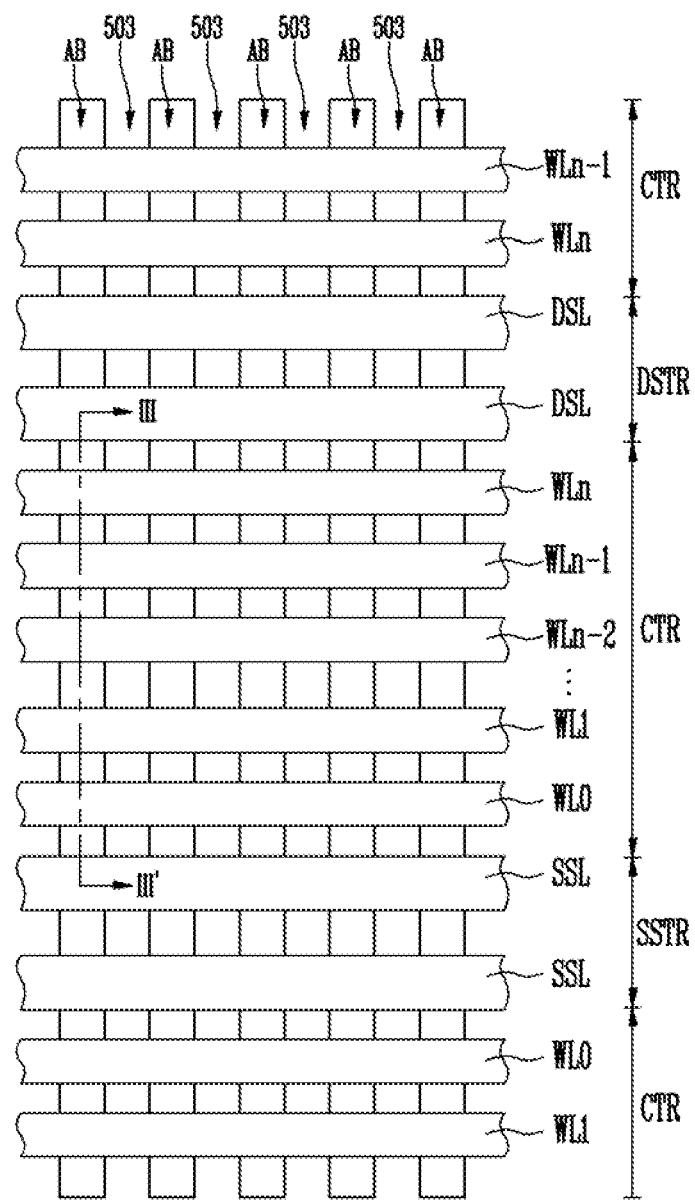
FIGS. 5A and 5B show an exemplary memory array region of a semiconductor device.
Figure 5B:
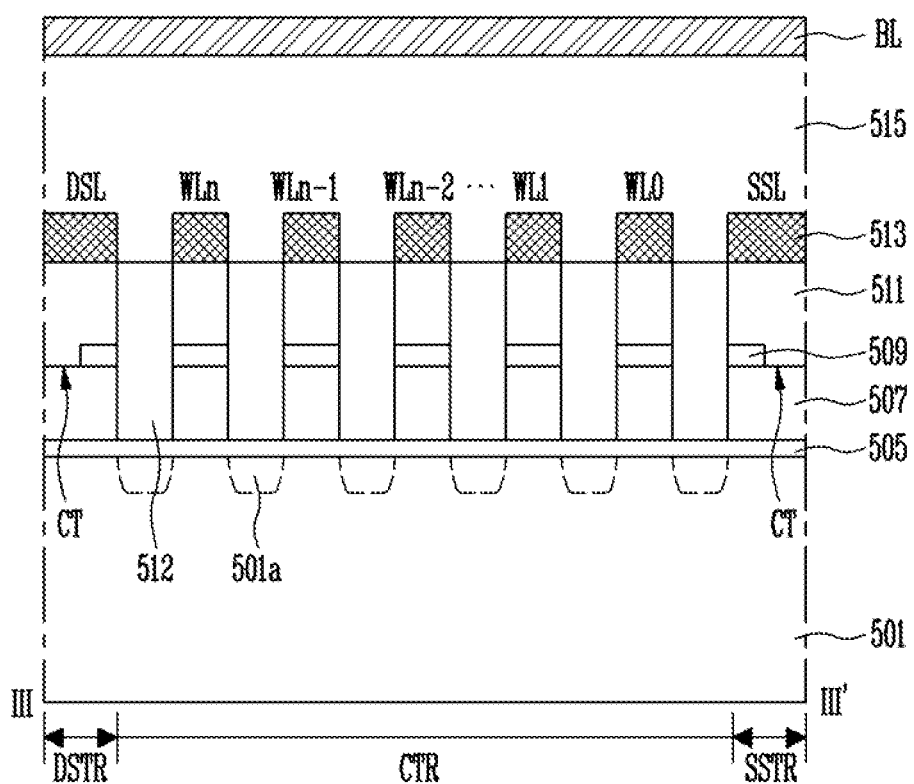

FIGS. 5A and 5B show an exemplary memory array region of an exemplary semiconductor device. FIG. 5A is a layout view showing a select transistor region and memory cell transistor region of an exemplary semiconductor device and FIG. 5B is a cross-sectional view showing the select transistor region and memory cell transistor region of an exemplary semiconductor device taken along the line III-III' shown in FIG. 5A. Depiction of a bit line is omitted in FIG. 5A.

Referring to FIGS. 5A and 5B, an exemplary semiconductor includes a drain select transistor region DSTR, a source select transistor region SSTR, and memory cell transistor region CTR, as well as the peripheral region shown in FIGS. 3A to 4B.

The drain select transistor region DSTR is a region in which a drain select transistor is formed, and the source select transistor region SSTR is a region in which a source select transistor is formed. The memory cell transistor region CTR is formed between the drain select transistor region DSTR and the source select transistor region SSTR.

A semiconductor substrate 501, including the drain select transistor region DSTR, the source select transistor region SSTR, and the memory cell transistor region CTR, has second active areas AB. The second active area AB are areas of the semiconductor substrate 501 that are divided by second isolation layers 503 in the drain select transistor region DSTR, the source select transistor region SSTR, and the memory cell transistor region CTR. In the drain select transistor region DSTR, the source select transistor region SSTR, and the memory cell transistor region CTR, the second isolation layers 503 and the second active areas AB are parallel to each other and formed in one direction and alternately arranged.

As shown in FIG. 5B, an exemplary semiconductor device further includes a gate insulating layer 505 formed over the drain select transistor region DSTR, the source select transistor region SSTR, the memory cell transistor region CTR, and gate patterns SSL, $WL_0$ to $WL_n$, and DSL formed on the gate insulating layer. In the drain select transistor region DSTR, the source select transistor region SSTR, and the memory cell transistor region CTR, the gate patterns SSL, $WL_0$ to $WL_n$, and DSL are formed in a cross direction of the second isolation layer 503 and the second active area AB. The gate patterns SSL, $WL_0$ to $WL_n$, and DSL include a source select line SSL, formed in the source select transistor region SSTR, a drain select line DSL, formed in the drain select transistor region DSTR, and word lines $WL_0$ to $WL_n$ formed in the memory cell transistor region CTR. In the memory cell transistor region CTR, the gate insulating layer 505 may be used as the tunnel insulating layer.

A source select transistor is formed at an intersection of the source select line SSL and the second active areas AB. A drain select transistor is formed at an intersection of the drain select line DSL and the second active area AB. Memory cell transistors are formed in an intersection part of the word lines $WL_0$ to $WL_n$ and the second active area AB.

Each of the gate patterns SSL, $WL_0$ to $WL_n$, and DSL is formed in a stacked structure of a first conductive layer 507, which serves as a floating gate, a dielectric layer 509, and a second conductive layer 511, which serves as a control gate. The first conductive layer 507 of the drain select transistor region DSTR, the source select transistor region SSTR, and the memory cell transistor region CTR is isolated by the second isolation layer 503. Accordingly, the first conductive layer 507 may remain only at the intersection part of the second conductive layer 511 of the gate patterns SSL, $WL_0$ to $WL_n$, and DSL and the second active area AB. In the drain select transistor region DSTR and the source select transistor region SSTR, the first conductive layer 507 may be connected to the second conductive layer 511 via a second contact hole CT that passes through the dielectric layer 509. In the memory cell transistor region CTR, the first conductive layer 507 is separated from the second conductive layer 511 by the dielectric layer 509. Accordingly, in the memory cell transistor region CTR, the first conductive layer 507 may be used as a floating gate that stores charges. Each of the gate patterns SSL, $WL_0$ to $WL_n$, and DSL may further include a third conductive layer 513 that is formed on the second conductive layer 511. For example, the second conductive layer 511 may be formed of polysilicon, and the third conductive layer 513 may be formed of a metal silicide layer, such as a cobalt silicide.

A junction area 501a, in which impurities are implanted, is formed in the second active area AB located on both sides of the gate patterns SSL, $WL_0$ to $WL_n$, and DSL. A first interlayer insulating layer 512 is formed between the gate patterns SSL, $WL_0$ to $WL_n$, and DSL. The first interlayer insulating layer 512 may remain lower than the gate patterns SSL, WL0 to WLn, and DSL. At least one second interlayer insulating layer 515 may be formed on the first interlayer insulating layer 512 and gate patterns SSL, $WL_0$ to $WL_n$ and DSL. A bit line BL may be formed on the second interlayer insulating layer 515. The bit line BL is connected to the junction area 501a formed in the drain select transistor region DSTR.

The gate insulating layer 505, first conductive layer 507, dielectric layer 509, second conductive layer 511, and third conductive layer 513 of the drain select transistor region DSTR, the source select transistor region SSTR, and the memory cell transistor region CTR may be formed of the same material and at the same layer as the gate insulating layer, first conductive layer, dielectric layer, second conductive layer, and third conductive layer formed in the peripheral region shown in FIGS. 3A and 3B or formed in the peripheral region shown in FIGS. 4A and 4B.

Next, a method of fabricating an exemplary semiconductor device will be schematically described.

A gate insulating layer and a first conductive layer are formed on a semiconductor substrate including a peripheral region, a memory cell transistor region and a select transistor region. The gate insulating layer may be formed of a silicon oxide layer, and the first conductive layer may be formed of a polysilicon layer. The first conductive layer forms a floating gate in the memory cell transistor region.

Before the formation of the gate insulating layer and the first conductive layer, as shown in FIGS. 3B and 4B, a first active area AA may be defined by forming a first isolation layer 303, 403 in a first isolation region of a semiconductor substrate 301, 401 in the peripheral region. The first isolation layer 303, 403 may be formed by forming a trench in the semiconductor substrate 301, 401 and then filling the trench with an insulating material.

After the formation of the gate insulating layer and the first conductive layer, the first active area AA may be defined by forming a second isolation layer 503 in a second isolation region of the semiconductor substrate in the drain select transistor region DSTR, the source select transistor region SSTR, and the memory cell transistor region CTR, as shown in FIG. 5A. The formation of the second isolation layer 503 may include forming a trench by etching the first conductive layer, gate insulating layer, and semiconductor substrate in the drain select transistor region DSTR, the source select transistor region SSTR, and memory cell transistor region CTR, filling the trench with an insulating material, and then etching the insulating material. As a result, the first conductive layer and gate insulating layer in the drain select transistor region DSTR, the source select transistor region SSTR, and memory cell transistor region CTR remain over the second active area AB, and the first conductive layer is isolated by the second isolation layer 503.

Next, a dielectric layer is formed. The first contact holes $CT_1$ to $CT_n$ are formed in the dielectric layer 309, 409 formed in the peripheral region and second contact hole CT is formed in the dielectric layer 509 in the drain select transistor region DSTR and the source select transistor region SSTR, as shown in FIGS. 3B, 4B, and 5B. The dielectric layer may be formed in a stacked structure, such as an oxide layer, a nitride layer, and an oxide layer. Next, a second conductive layer is formed on the dielectric layer to fill the first $CT_1$ to $CT_n$ and the second contact hole CT, and a gate mask, defining an area at which the gate patterns G, SSL, DSL, and $WL_0$ to $WL_n$ shown in FIGS. 3B, 4B, and 5B will be formed, is formed. Next, the second conductive layer, the dielectric layer, and the first conductive layer are etched using the gate mask as an etch barrier. Here, the gate insulating layer, located under the first conductive layer, may be further etched. As a result, as shown in FIGS. 3B, 4B, and 5B, gate patterns G, SSL, DSL, and $WL_0$ to $WL_n$ have a stacked structure of a first conductive layer 307, 407, 507, a dielectric layer 309, 409, 509, and a second conductive layer 311, 411, 511.

After the formation of the gate patterns G, SSL, DSL, and $WL_0$ to $WL_n$, a silicidation process may be performed in order to reduce the resistance of the gate patterns G, SSL, DSL, and $WL_0$ to $WL_n$. The silicidation process may include filling spaces between the gate patterns G, SSL, DSL, and $WL_0$ to $WL_n$ with a first interlayer insulating layer 512, removing the first interlayer insulating layer 512 and the gate mask, so that a top and sidewalls of the second conductive layer 311, 411, 511 is exposed, and siliciding the exposed second conductive layer 311, 411, 511. A part of the second conductive layer 311, 411, 511, which is formed of a polysilicon layer, reacts with a metal in the silicidation process and is changed to a third conductive layer 313, 413, 513, which is a metal silicide layer.

Next, at least one layer of an interlayer insulating layer 315, 415, 515 is formed to cover the gate patterns G, SSL, DSL, and $WL_0$ to $WL_n$. Then, as shown in FIG. 3B or 4B, the interlayer insulating layer 315, 415 in the peripheral region is etched to form holes. The contact plugs $CP_1$ to $CP_n$, $CP_{a1}$ to $CP_{an}$, and $CP_{b1}$ and $CP_{b2}$ are formed of a conductive material in the holes to connect the gate pattern G. While etching the interlayer insulating layer 315, 415, a part of the third conductive layer 313, 413, 513 may be etched. Next, as shown in FIG. 3B or 4B, a metal line 321, 421 is formed on the interlayer insulating layer 315, 415. In addition, as shown in FIG. 53, a bit line BL is formed on the interlayer insulating layer 515.

Figure 6:
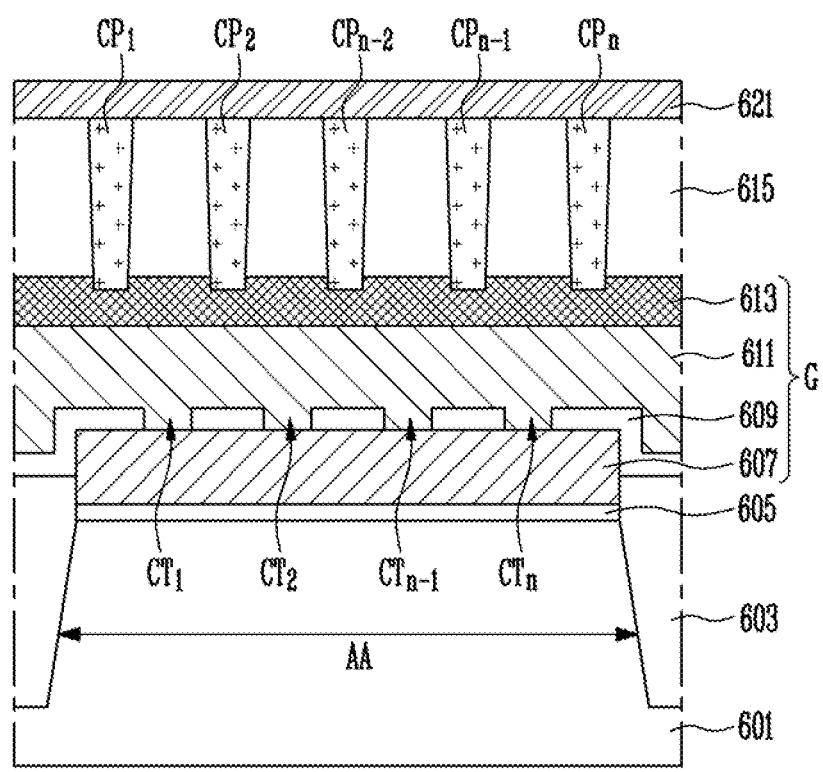
FIG. 6 shows an exemplary semiconductor device.

FIG. 6 shows an exemplary semiconductor device including a semiconductor substrate 601 having a first active area AA, defined by a first isolation layer 603, a gate insulating layer 605 formed on the semiconductor substrate 601, and a gate pattern G formed on the gate insulating layer 605. The contact plugs $CP_1$ to $CP_n$ pass through an interlayer insulating layer 615, formed on the gate pattern G, and are commonly connected to the gate pattern G. The contact plugs $CP_1$ to $CP_n$ are connected to a metal line 621 formed on the interlayer insulating layer 615. The gate voltage applied to the metal line 621 is applied to the gate pattern G via the contact plugs $CP_1$ to $CP_n$.

The gate pattern G, of the exemplary semiconductor device, may be formed in a stacked structure of a first conductive layer 607, a dielectric layer 609, and a second conductive layer 611. In the peripheral region, the second conductive layer 611 may be connected to the first conductive layer 607 via first contact holes $CT_1$ to $CT_n$ that pass through the dielectric layer 609. The gate pattern G may further include a third conductive layer 613 having a lower resistance than a resistance of the second conductive layer 611. The third conductive layer 613 is formed on the second conductive layer 611. The gate insulating layer 605 and the first conductive layer 607 are isolated by the first isolation layer 603. The gate insulating layer 605 and the first conductive layer 607 remain at an intersection of the first active area AA and the second conductive layer 611. The shapes and materials of the second conductive layer 611 and the third conductive layer 613, the shape and material of the dielectric layer 609, and the arrangement of the first contact holes $CT_1$ to $CT_n$ may be the similar to those described above with respect in FIGS. 3A and 3B.

The contact plugs $CP_1$ to $CP_n$, as described with respect to FIGS. 3A and 3B, are formed over the first active area AA and are arranged so that each of the contact plugs $CP_1$ to $CP_n$ overlaps a corresponding portion of the dielectric layer 609. Accordingly, in the exemplary semiconductor device, the malfunction rate may be reduced by reducing the parasitic resistance. In addition, since the malfunction rate of the exemplary semiconductor device is reduced by using the single gate pattern, the size of the exemplary semiconductor device may be reduced. Further, in the exemplary semiconductor device, the reliability of the gate insulating layer 605 may be enhanced by reducing the stress due to the electric field concentrated on the contact plugs $CP_1$ to $CP_n$.

Next, a method of fabricating an exemplary semiconductor device will be described with reference to FIGS. 5A, 5B, and 6.

A gate insulating layer and a first conductive layer are formed on a semiconductor substrate including a peripheral region, a memory cell transistor region, and a select transistor region. The gate insulating layer may be formed of a silicon oxide layer, and the first conductive layer may be formed of a polysilicon layer. The first conductive layer forms a floating gate in the memory cell transistor region.

After the formation of the gate insulating layer and the first conductive layer, as shown in FIG. 6, a first isolation layer 603 is formed in a first isolation region of the semiconductor substrate 601 in the peripheral region. At the same time a second isolation layer 503 is formed in a second isolation region of the semiconductor substrate 601 in the drain select transistor region DSTR, the source select transistor region SSTR, and the memory cell transistor region CTR. (As shown in FIG. 5A.) As a result, a first active area AA is defined in the peripheral region and the second active areas AB are defined in the drain select transistor region DSTR, the source select transistor region SSTR, and the memory cell transistor region CTR. In order to form the first isolation layers 603 and the second isolation layer 503, the first conductive layer and gate insulating layer, formed on the first isolation region and the second isolation region, are etched to expose the semiconductor substrate 601, 501. Next, areas of the semiconductor substrate 601, 501 corresponding to the first isolation region and the second isolation region, are etched. Subsequently, the etched areas are filled with an insulating material. The insulating material is etched to form the first isolation layer 603 and the second isolation layer 503. As a result, the gate insulating layer 605 and the first conductive layer 607 remain in the first and second active areas AA and AB, respectively. In addition, the gate insulating layers 605 and the first conductive layers 607 are isolated by the first isolation layer 603 in the peripheral region. In the drain select transistor region DSTR, the source select transistor region SSTR and the memory cell transistor region CTR, the gate insulating layers 505 and the first conductive layers 507 are isolated by the second isolation layer 503.

Next, a dielectric layer is formed. First contact holes $CT_1$ to $CT_n$ are formed in the dielectric layer 609 in the peripheral region, as shown in FIG. 6. A second contact hole CT is formed in the dielectric layer 509 in the drain select transistor region DSTR and the source select transistor region SSTR as shown in FIG. 5B. The dielectric layer 509, 609 may be formed in a stacked structure of an oxide layer, a nitride layer, and an oxide layer. Next, the second conductive layers 611, 511 are formed on the dielectric layer to fill the first contact holes $CT_1$ to $CT_n$ and second contact hole CT, respectively. A gate mask defines an area at which the gate patterns G, SSL, DSL, and WL0 to WLn (shown in FIGS. 6 and 5B) will be formed. Next, the second conductive layers 611, 511, the dielectric layers 609, 509, and the first conductive layers 607, 507 are etched using the gate mask as an etch barrier. Here, the gate insulating layers 605, 505 may be further etched. As a result, gate patterns G, SSL, DSL, and $WL_0$ to $WL_n$ (as shown in FIGS. 6 and 5B) are formed.

After the formation of the gate patterns G, SSL, DSL, and $WL_0$ to $WL_n$, a silicidation process may be performed in order to reduce the resistance of the gate patterns G, SSL, DSL, and $WL_0$ to $WL_n$. Parts of the second conductive layers 611, 511, which are formed of a polysilicon layer, are changed to the third conductive layers 613, 513, which are metal silicide layers, through a siliciding process.

Next, at least one interlayer insulating layer 615, 515, covering the gate patterns G, SSL, DSL, and $WL_0$ to $WL_n$, is formed. Then, as shown in FIG. 6, the interlayer insulating layer 615 in the peripheral region is etched to form holes, and the contact plugs $CP_1$ to $CP_n$, which are connected to a gate pattern G, are formed by filling the holes with a conductive layer. While etching the interlayer insulating layer 615, a part of the third conductive layer 613 may be etched. Next, as shown in FIG. 6, a metal line 621 is formed on the interlayer insulating layer 615.

Figure 7:
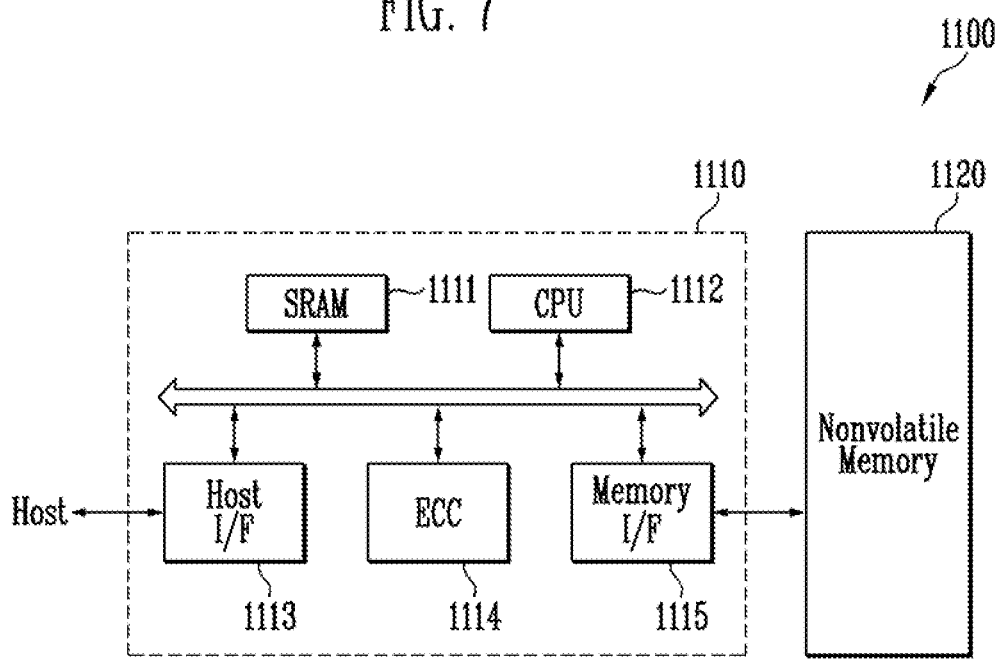
FIG. 7 shows a configuration diagram of an exemplary memory system.

FIG. 7 is a configuration diagram showing an memory system.

Referring to FIG. 7, the exemplary memory system 1100 includes a non-volatile memory device 1120 and a memory controller 1110.

The non-volatile memory device 1120 includes an exemplar non-volatile memory device described with reference to FIGS. 3A to 6. In addition, the ion-volatile memory device 1120 may be a multi-chip package configured with two or more flash memory chips.

The memory controller 1110 is configured to control the non-volatile memory device 1120, and may include an SRAM 1111, a CPU 1112, a host interface 1113, an ECC 1114, or a memory interface 1115. The SRAM 1111 is used as an operation memory for the CPU 1112, the CPU 1112 performs an overall control operation for data exchange of the memory controller 1110, and the host interface 1113 includes a data exchange protocol of a host connected to the memory system 1100. In addition, the ECC 1114 detects and corrects errors included in data read from the non-volatile memory device 1120, and the memory interface 1115 performs interfacing with the non-volatile memory device 1120. Additionally, the memory controller 1110 may further include a ROM, etc. that stores code data for interfacing with a host.

The memory system 1100 having such a configuration may be a memory card or solid-state disk (SSD) in which the non-volatile memory device 1120 is combined with the memory controller 1110. For example, when the memory system 1100 is an SSD, the memory controller 1110 may communicate with an exterior (for example, a host) through one of a variety of interface protocols such as USB, MMC, PCI-E, SATA, PATA, SCSI, ESDI, or IDE.

Figure 8:
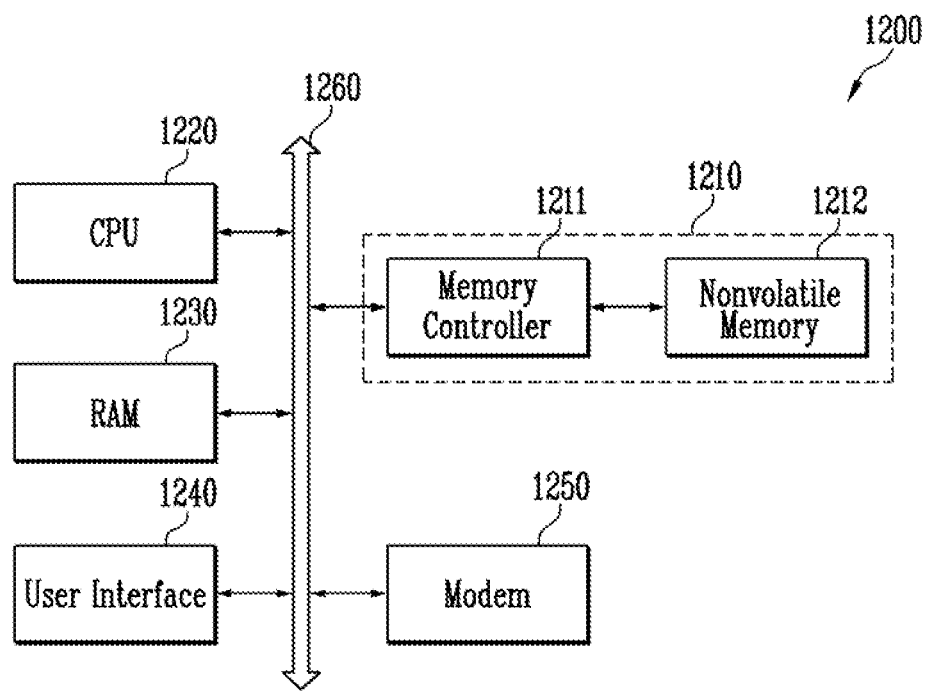
FIG. 8 shows a configuration diagram of an exemplary computing system.

FIG. 8 is a configuration diagram showing an exemplary computing system.

Referring to FIG. 8, the exemplary computing system 1200 may include a CPU 1220, RAM 1230, a user interface 1240, a modem 1250, and a memory system 1210 that are electrically connected to a system bus 1260. In addition, when the computing system 1200 is a mobile apparatus, a battery for supplying an operation voltage to the computing system 1200, an application chipset, a camera image processor (CIS), or a mobile DRAM may be further included. The memory system 1210 may be configured with a non-volatile memory 1212 and a memory controller 1211, as described with reference to FIG. 7.

An exemplary semiconductor memory device can reduce a parasitic resistance in a contact plug arranged in an active area and connected to a gate pattern. Since the exemplary semiconductor memory device reduces an error rate between a gate resistance predicted by a transistor model and an actual transistor, a malfunction rate of a semiconductor device may be reduced.

In addition, in an exemplary embodiment, contact plugs in an active area may be formed to overlap corresponding portion of a dielectric layer by arranging the contact plugs in the active area to be offset from contact holes in the dielectric layer. Accordingly, an exemplary embodiment may protect the gate dielectric layer by reducing stress due to the electric field concentrated on the contact plug while fabricating the semiconductor device by use of the dielectric layer. As a result, the gate insulating layer may have enhanced reliability.

The drawings and specification have disclosed an exemplary embodiment. Although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor device, comprising:
 a semiconductor substrate including a single first active area defined by a first isolation layer;
 a gate insulating layer formed on the semiconductor substrate;
 a first conductive layer formed on the gate insulating layer;
 a dielectric layer formed on the first conductive layer;
 a plurality of first contact holes passing through the dielectric layer;
 a second conductive layer, formed on the dielectric layer, the second conductive layer filling the plurality of first contact holes to contact the first conductive layer; and
 a plurality of first contact plugs connected to the second conductive layer,
 wherein the plurality of first contact plugs are offset from the plurality of first contact holes to overlap the dielectric layer, and wherein the plurality of first contact plugs and the plurality of first contact holes are overlapped with the single first active area, and wherein the plurality of first contact plugs are connected to a single gate pattern comprised of the first conductive layer and the second conductive layer over the single first active area.

2. The semiconductor device of claim 1, wherein the plurality of first contact plugs and the plurality of first contact holes are alternately arranged.

3. The semiconductor device of claim 1, further comprising:
 a metal line formed over the plurality of first contact plugs, the metal line serving as a common connection for the plurality of first contact plugs.

4. The semiconductor device of claim 1, further comprising:
 a second contact plug connected to the second conductive layer, the second contact plug being aligned over the first isolation layer.

5. The semiconductor device of claim 4, wherein the gate insulating layer and the first conductive layer extend over the first isolation layer that is aligned under the second contact plug.

6. The semiconductor device of claim 4, further comprising:
 a metal line formed over the plurality of first contact plugs and the second contact plug, the metal line serving as a common connection for the plurality of first contact plugs and the second contact plug.

7. The semiconductor device of claim 1, wherein the semiconductor substrate further comprises a select transistor region and a memory cell transistor region each including a second active area defined by a second isolation layer.

8. The semiconductor device of claim 7, wherein the gate insulating layer, the first conductive layer, the dielectric layer and the second conductive layer are further formed over the second active area of the semiconductor substrate,
 wherein the gate insulating layer, which if formed over the second active area, functions as a tunnel insulating layer,
 the first conductive layer, which if formed over the second active area, functions as a floating gate, and
 the second conductive layer, which if formed over the second active area, functions as a control gate.

9. The semiconductor device of claim 8, wherein the control gate is connected to the floating gate passing through the dielectric layer in the select transistor region.

10. The semiconductor device of claim 8, wherein the floating gate is isolated by the second isolation layer.

* * * * *